United States Patent
Yun et al.

(10) Patent No.: US 12,554,200 B2
(45) Date of Patent: Feb. 17, 2026

(54) MASKLESS EXPOSURE DEVICE AND DISPLAY DEVICE

(71) Applicant: Samsung Display Co., LTD., Yongin-si (KR)

(72) Inventors: Sang Hyun Yun, Yongin-si (KR); Kab Jong Seo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 271 days.

(21) Appl. No.: 18/128,574

(22) Filed: Mar. 30, 2023

(65) Prior Publication Data
US 2024/0036471 A1  Feb. 1, 2024

(30) Foreign Application Priority Data
Jul. 28, 2022 (KR) .................. 10-2022-0093576

(51) Int. Cl.
*G03F 7/20* (2006.01)
*H10D 86/40* (2025.01)
*H10D 86/60* (2025.01)

(52) U.S. Cl.
CPC .......... *G03F 7/2051* (2013.01); *H10D 86/40* (2025.01); *H10D 86/60* (2025.01)

(58) Field of Classification Search
CPC ...... G03F 7/2051; G03F 7/20; G03F 7/70383; G03F 7/704; G03F 7/70491; G03F 7/70558; G03F 7/70116; G03F 7/70291; G03F 7/70358; H10D 86/40; H10D 86/60; H10K 59/1213
See application file for complete search history.

(56) References Cited

U.S. PATENT DOCUMENTS

| 6,537,738 | B1* | 3/2003 | Mei | G03F 7/704 |
| | | | | 430/311 |
| 11,392,038 | B2* | 7/2022 | Kim | G03F 7/2051 |
| 2006/0033897 | A1* | 2/2006 | Okuyama | G03B 27/42 |
| | | | | 355/53 |

FOREIGN PATENT DOCUMENTS

| CN | 108681213 | 10/2018 |
| CN | 110780546 | 2/2020 |
| KR | 1020120100208 | 9/2012 |
| KR | 101678070 | 11/2016 |
| KR | 1020200014089 | 2/2020 |

* cited by examiner

*Primary Examiner* — Hung V Nguyen
(74) *Attorney, Agent, or Firm* — CANTOR COLBURN LLP

(57) ABSTRACT

A maskless exposure device includes: a light source for emitting a beam, a light modulator for modulating the beam according to an exposure pattern, an optical system for transferring the modulated beam onto a substrate in the form of a beam spot array, a position determining unit for generating relative position data between the beam spot array and the substrate, and a control unit for controlling the light modulator based on the position data of the position determining unit.
The beam spot array includes alignment areas and out-of-alignment areas which are alternately disposed, on/off-spots which overlap the alignment areas, and neutral spots which overlap the out-of-alignment areas and at which the substrate is not irradiated with the beam, and a distance between on/off-spots adjacent to each other at a first point in time is different from a distance between on/off-spots adjacent to each other at a second point in time.

17 Claims, 16 Drawing Sheets

MASKLESS EXPOSURE DEVICE AND DISPLAY DEVICE

This application claims priority to Korean Patent Application No. 10-2022-0093576 filed on Jul. 28, 2022, and all the benefits accruing therefrom under 35 U.S.C. 119, the contents of which in its entirety are herein incorporated by reference.

BACKGROUND

1. Technical Field

The present disclosure relates to a maskless exposure device and a display device.

2. Description of the Related Art

In general, in order to form a metal pattern including a thin film transistor ("TFT"), which is a switching element of a display substrate, and signal lines, a metal layer and a photoresist layer are sequentially formed on the display substrate, and a mask having a shape corresponding to the metal pattern is disposed on the photoresist layer.

Subsequently, light is provided from above the mask to expose and develop the photoresist layer, thereby forming a photoresist pattern corresponding to the shape of the mask. The metal pattern may be formed by etching the metal layer using the photoresist pattern as an etch stop film.

However, in a case of a display substrate including a plurality of metal patterns, shapes of the respective metal patterns are different from each other, and thus, a plurality of masks according to the number of metal patterns are required. In addition, whenever the shape of each of the metal patterns is changed, a shape of the mask should also be changed, and thus, the mask should be manufactured again. A manufacturing cost of the mask is quite high, which causes an increase in production cost of the display substrate.

SUMMARY

In order to solve such a problem, a maskless exposure device capable of providing a plurality of beams to a substrate without using a mask has been used. The maskless exposure device may form a desired photoresist pattern by individually turning on/off the beams to selectively provide the beams to the substrate.

Aspects of the present disclosure provide a maskless exposure device capable of alleviating an oblique stain occurring when exposure is performed through the maskless exposure device in a simple structure.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a maskless exposure device including: a light source for emitting an exposure beam, a light modulator for modulating the exposure beam according to an exposure pattern, an optical system for transferring the modulated exposure beam onto a substrate in the form of a beam spot array, a position determining unit for generating relative position data between the beam spot array and the substrate, and a control unit for controlling the light modulator based on the position data of the position determining unit. The beam spot array includes alignment areas and out-of-alignment areas which are alternately disposed, on/off-spots which overlap the alignment areas, and neutral spots which overlap the out-of-alignment areas and at which the substrate is not irradiated with the modulated exposure beam, and a distance between on/off-spots adjacent to each other among the on/off-spots at a first point in time is different from a distance between on/off-spots adjacent to each other among the on/off-spots at a second point in time.

The control unit may transfer the exposure pattern in which an arrangement and on-states or off-states of the on/off-spots are adjusted according to an accumulated light amount, to the light modulator.

The modulated exposure beam and the accumulated light amount may be provided in plurality, respectively, and the exposure pattern may decrease a deviation between the accumulated light amounts of the modulated exposure beams irradiated to a plurality of patterns disposed on the substrate.

A width of each of the alignment areas and a width of each of the out-of-alignment areas in a cross-sectional view may be the same as each other.

A distance between the on/off-spots adjacent to each other may be about 0.01 micrometers (μm) to about 1.0 μm.

The modulated exposure beam may be provided in plurality, and the control unit may receive the position data from the position determining unit and confirms information of patterns disposed on the substrate, and determine accumulated light amounts of the modulated exposure beams irradiated to the patterns disposed on the substrate in a scan process in which the substrate moves in a scan direction.

The control unit may generate the exposure pattern changing on-states or off-states of the on/off-spots so that a deviation between the accumulated light amounts is decreased.

The light modulator may modulate the exposure beam according to the exposure pattern.

Each of the alignment areas may include a first alignment area and a second alignment area disposed adjacent to each other with one out-of-alignment area of the out-of-alignment areas therebetween, and a distance between a center point of the first alignment area and a center point of the second alignment area may be twice the shortest distance between the first alignment area and the second alignment area.

A width of the first alignment area may be the same as the shortest distance between the first alignment area and the second alignment area.

An arrangement of the on/off-spots in the first alignment area may be different from an arrangement of the on/off-spots in the second alignment area.

Each of the on/off-spot may be in an on-state when the on/off-spot overlaps a pattern disposed on the substrate in an exposure process, and is in an off-state when the on/off-spot does not overlap the pattern in the exposure process.

There is provided a maskless exposure device including: a light source for emitting an exposure beam, a light modulator for modulating the exposure beam according to an exposure pattern, an optical system for transferring the modulated exposure beam onto a substrate in the form of a beam spot array, a position determining unit for generating relative position data between the beam spot array and the substrate, and a control unit for controlling the light modulator based on the position data of the position determining unit. The beam spot array includes a first spot, a second spot, and a third spot of which on/off are controlled by the light modulator, at a first point in time, the first spot and the second spot are disposed adjacent to each other, and at a second point in time, the third spot is disposed between the first spot and the second spot.

A distance between the first spot and the second spot may be about 0.01 μm to about 1.0 μm.

The modulated exposure beam may be provided in plurality, and the control unit may receive the position data from the position determining unit and confirms information of patterns disposed on the substrate, and determine accumulated light amounts of the modulated exposure beams irradiated to the patterns disposed on the substrate in a scan process in which the substrate moves in a scan direction.

The control unit may generate the exposure pattern changing an on-state or an off-state of the first spot so that a deviation between the accumulated light amounts is decreased.

The light modulator may modulate the exposure beam according to the exposure pattern.

There is provided a display device including: a semiconductor layer disposed on a substrate, and a gate electrode disposed to overlap the semiconductor layer. In a plan view, the semiconductor layer includes: a first portion including a first edge extending along a first direction, a second portion including a second edge extending along a second direction perpendicular to the first direction, and a third portion including a third edge extending along a third direction that is a direction between the first direction and the second direction, and all of the first edge, the second edge, and the third edge have line edge roughnesses.

The line edge roughnesses of the first edge, the second edge, and the third edge a may be different from each other.

The line edge roughness of the third edge may have a value between the line edge roughness of the first edge and the line edge roughness of the second edge.

A maskless exposure device according to embodiments has an effect of preventing a deviation between accumulated light amounts for each pattern, which is an exposure target, by adjusting an arrangement and states of on/off-spots. Accordingly, it is possible to minimize an oblique stain occurring on the exposure target in a maskless exposure process.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
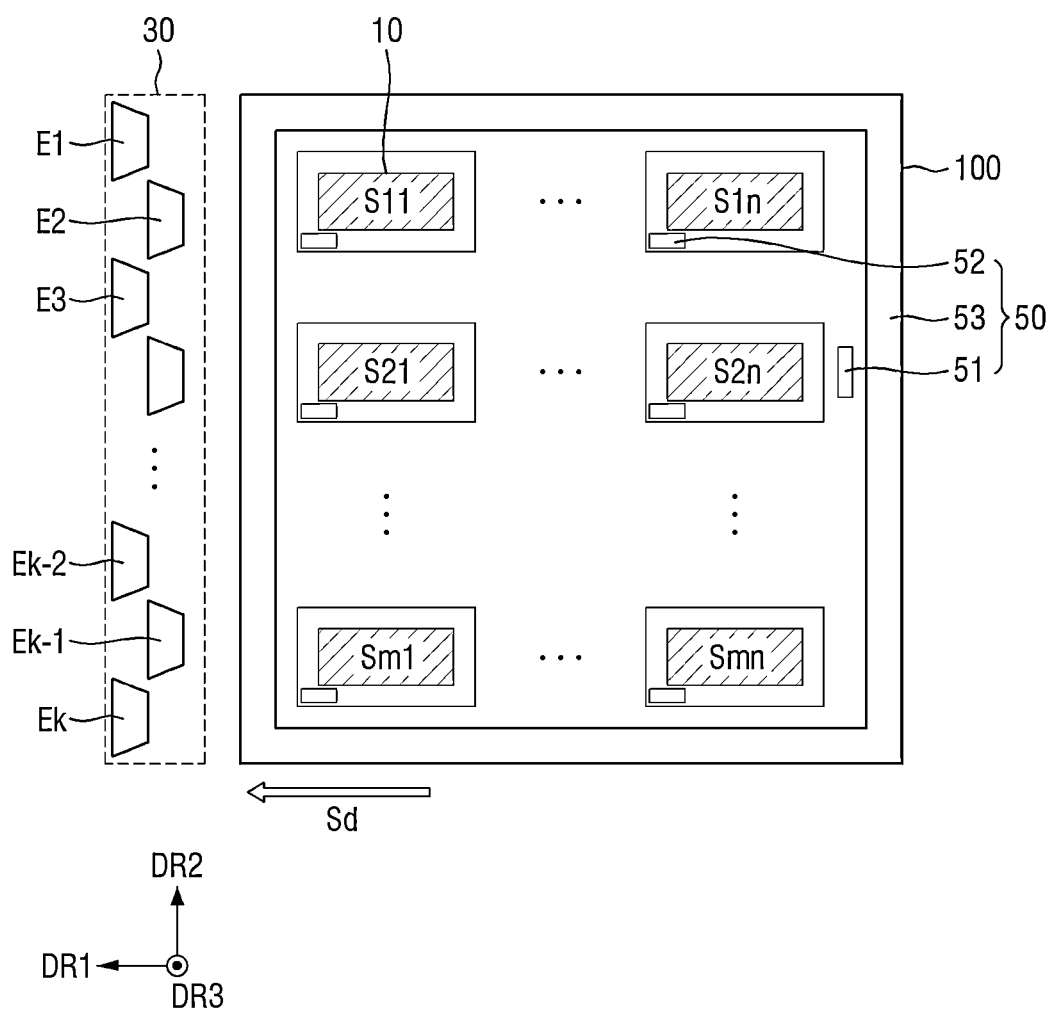
FIG. 1 is a plan view illustrating a maskless exposure device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. "A/B" means "A and/or B." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, embodiments of the present disclosure will be described with reference to the accompanying drawings.

FIG. 1 is a plan view illustrating a maskless exposure device according to an embodiment.

Referring to FIG. 1, a substrate 100 according to an embodiment of the present disclosure is a mother substrate for forming a display panel, and includes a plurality of first areas 10 and a second area 50, which is a portion other than the first areas. A plurality of panels (S11 . . . Smn) arranged in a matrix type are formed in the first areas 10. The second area 50 includes a glass identification number ("ID") area 51 in which a unique number of the substrate 100 is formed and cell ID areas 52 in which unique numbers of the plurality of panels are formed. In addition, the second area 50 includes an edge exposure area 53, which is an edge portion of the substrate 100.

The substrate 100 is transferred and exposed below an exposure unit 30 along a scan direction Sd. The scan direction Sd may be a first direction DR1. The substrate 100 is transferred to the exposure unit 30 by a stage 20 (See FIG. 2) disposed therebelow.

An exposure method includes step exposure or scan exposure. The step exposure refers to exposure including a repeated operation of moving and stopping the substrate 100 during exposure, and the scan exposure refers to exposure including a continuous operation of the substrate 100 during exposure. An island pattern may be mainly formed by the step exposure, and a strip pattern may be mainly formed by the scan exposure.

The exposure unit 30 includes a plurality of exposure heads E1, E2, E3, . . . , Ek–2, Ek–1, and Ek (here, k is a natural number), and the plurality of exposure heads are arranged along a second direction DR2 orthogonal to the first direction DR1, which is the scan direction Sd.

The plurality of exposure heads E1, E2, E3, . . . , Ek–2, Ek–1, and Ek are arranged in, for example, two rows. The exposure heads in a first row arranged in the second direction DR2 and the exposure heads in a second row arranged in the second direction DR2 in proximity to the first row may be alternately disposed. Although not illustrated, the exposure heads may be arranged in various arrangement forms along the second direction DR2. Hereinafter, for convenience of explanation, one exposure head 1000 of the plurality of exposure heads E1, E2, E3, . . . , Ek–2, Ek–1, and Ek will be representatively described.

Since the exposure unit 30 that is fixed exposes the substrate 100 moving in the first direction DR1, an exposure pattern is formed on the substrate 100 in a direction opposite to the first direction DR1.

The exposure head 1000 includes a digital micro-mirror device (DMD). The digital micro-mirror device (DMD) may irradiate the substrate 100 with an exposure beam according to on/off data. A source beam is reflected from a digital mirror of a corresponding cell of the digital micro-mirror device (DMD), such that an exposure beam 1150 is generated, and the exposure beam 1150 is emitted from the exposure head 1000.

Figure 2:
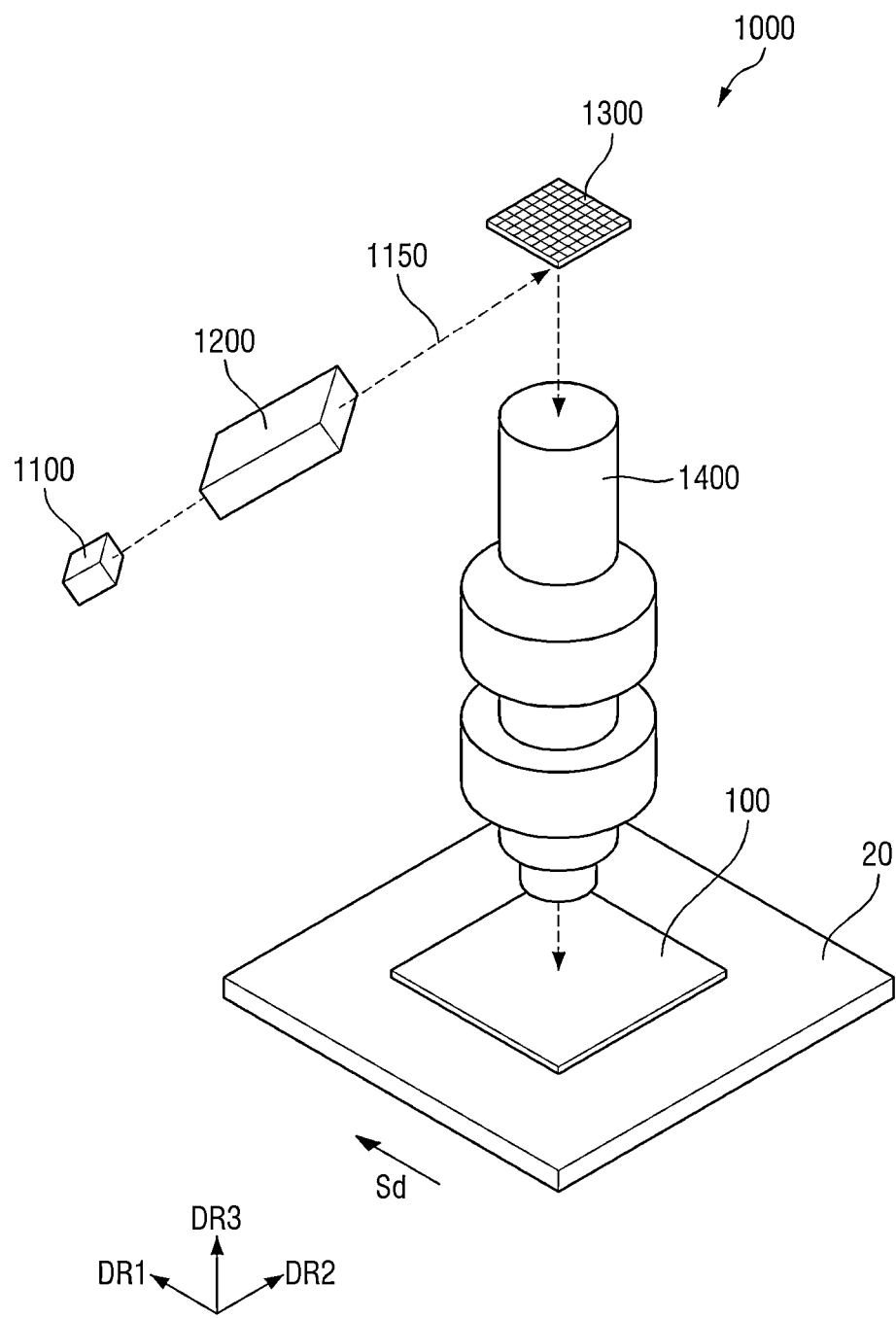
FIG. 2 is a view illustrating an exposure head of the maskless exposure device according to an embodiment of the present disclosure.
Figure 3:
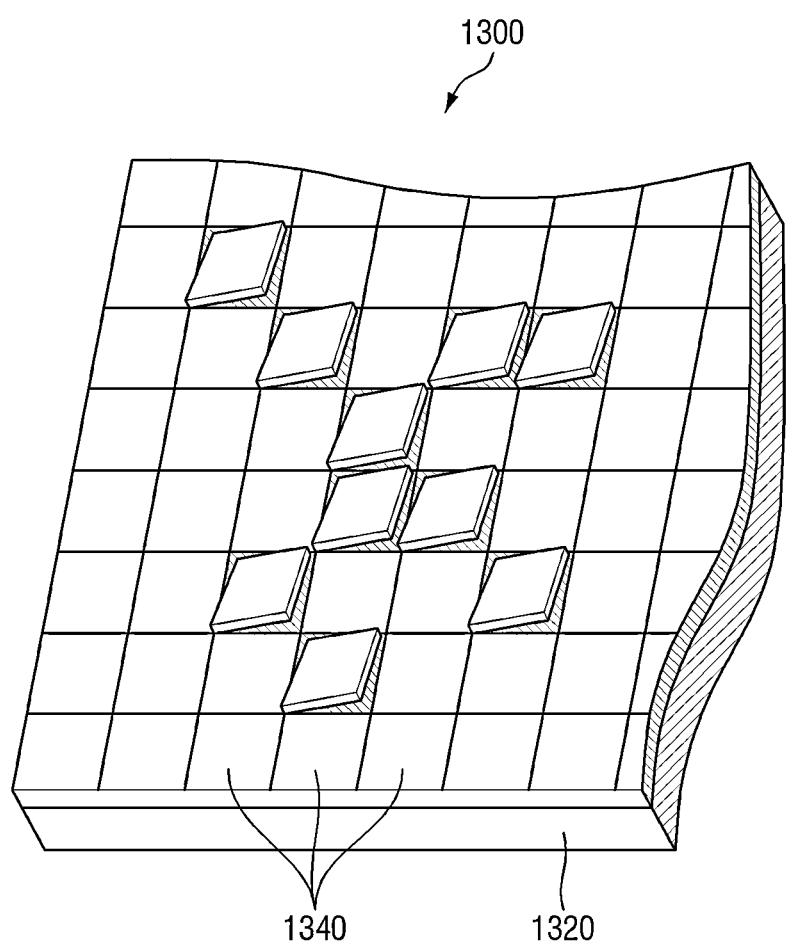
FIG. 3 is a perspective view illustrating a configuration of a digital micro mirror device ("DMD") of the maskless exposure device according to an embodiment of the present disclosure.

FIG. 2 is a view illustrating an exposure head of the maskless exposure device according to an embodiment of the present disclosure. FIG. 3 is a perspective view illustrating a configuration of a digital micro mirror device (DMD) of the maskless exposure device according to an embodiment of the present disclosure.

Referring to FIG. 2, the exposure head 1000 includes a light source 1100 for emitting the exposure beam 1150, an illumination optical system 1200 for correcting the exposure beam 1150 emitted from the light source 1100 to have a uniform illuminance and for emitting the exposure beam 1150, a light modulator 1300 for modulating the exposure beam 1150 that has passed through the illumination optical system 1200 according to pattern information (image data), and a projection optical system 1400 for transferring the exposure beam 1150 modulated by the light modulator 1300 onto the substrate 100 in the form of a beam spot array.

The light source 1100 emits a beam for exposure, and includes a semiconductor laser, an ultraviolet lamp, or the like. The beam emitted from the light source 1100 is output to the substrate 100 disposed on the stage 20 through the light modulator 1300 and the projection optical system 1400.

The light modulator 1300 includes a spatial light modulator ("SLM"). The light modulator 1300 may be, for example, a micro electromechanical systems ("MEMS")-type digital micro-mirror device (DMD), a two-dimensional grating light valve ("GLV"), an electro-optical element using lead zirconate titantate ("PLZT"), which is a transparent ceramic, a ferroelectric liquid crystal ("FLC"), or the like, and may be preferably a DMD. Hereinafter, for convenience of explanation, the present disclosure will be described using the light modulator 1300 formed as the DMD.

Referring to FIG. 3, the DMD is a mirror device including a memory cell 1320 (e.g., a static random access memory ("SRAM") cell) and a plurality of micro-mirrors 1340 arranged in an L×M matrix type on the memory cell 1320 (L and M are natural numbers). By making angles of the respective micro-mirrors 1340 different from each other based on a control signal generated according to the image data, desired light is reflected to the projection optical system 1400 and light other than the desired light is sent at other angles to be blocked.

When a digital signal is written to the memory cell 1320 of the light modulator 1300 formed as the DMD, the micro-mirrors 1340 are inclined in the range of a predetermined angle (e.g., ±12°) with respect to a diagonal line. On/off/neutral control of each micro-mirror 1340 is performed by a control unit 3000 to be described later. Light reflected by the micro-mirror 1340 in an on-state exposes an exposure target (usually a photoresist ("PR")) on the substrate 100, and light reflected by the micro-mirror 1340 in off/neutral states does not expose the exposure target on the substrate 100. The exposure target is used in order to form a mask of patterns when the patterns are formed on the substrate 100. The exposure target may be formed by applying a photosensitive resin such as a photosensitive epoxy resin on a surface of the substrate 100.

The light reflected by the micro-mirror may be divided into three states: an on-state, an off-state, and a neutral state. The light in the on-state refers to light of which an image is formed on a designated light spot and overlaps the pattern on the substrate 100. The light in the off-state refers to light of which an image is formed on a designated light spot and does not overlap the pattern on the substrate 100. The light in the off-state is adjusted so as not to be incident on the substrate 100 in order not to expose other exposure targets on the substrate 100. The light in the neutral state refers to light of which an image is not formed on the designated light spot. The light in the neutral state is not an on/off-adjustment target, and may be adjusted so as not to be incident on the substrate 100 regardless of whether or not the on/off-spot overlaps the pattern on the substrate 100. An on/off-spot is defined as a spot in which the light reflected by the micromirror is adjusted to the on-state or the off-state on the substrate 100. That is, the on/off-spot is defined as a spot adjusted to an on-state when the on/off-spot overlaps the pattern disposed on the substrate 100 in a scan process and adjusted to an off-state when the on/off-spot does not overlap the pattern disposed on the substrate 100 in the scan process.

Figure 4:
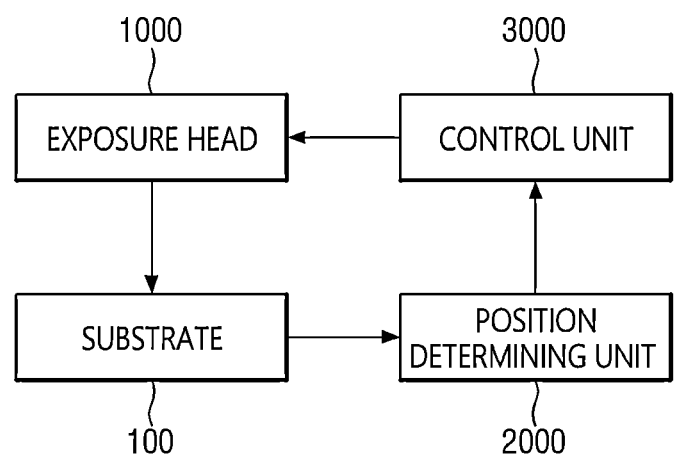
FIG. 4 is a block diagram of the maskless exposure device according to an embodiment.
Figure 5:
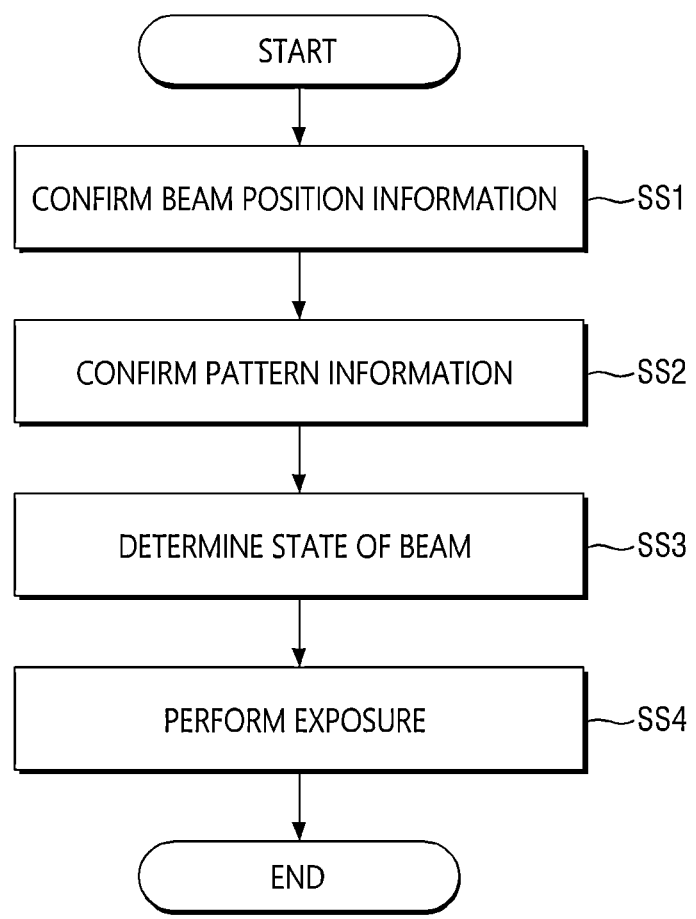
FIG. 5 is a flowchart illustrating a method of driving the maskless exposure device according to an embodiment.

FIG. 4 is a block diagram of the maskless exposure device according to an embodiment. FIG. 5 is a flowchart illustrating a method of driving the maskless exposure device according to an embodiment.

Referring to FIGS. 4 and 5, the maskless exposure device according to an embodiment includes the exposure head 1000, a position determining unit 2000, and a control unit 3000. The substrate 100 is disposed on the stage 20, and the exposure head 1000 is disposed in an initial setting state. When the setting of the exposure head 1000 and the substrate 100 is completed, the position determining unit 2000 confirms beam position information based on a relative arrangement between the exposure head 1000 and the substrate 100 (SS1), and confirms pattern information of the patterns disposed on the substrate 100 (SS2). That is, the position determining unit 2000 generates relative position data between the beam spot array, the substrate 100, and the patterns disposed on the substrate 100. The position determining unit 2000 transmits the position data to the control unit 3000. The control unit 3000 may generate accumulated light amount data by calculating an accumulated light amount of light irradiated to each pattern disposed on the substrate 100 according to a scan of the stage 20 based on the position data received from the position determining unit 2000. The control unit 3000 may change a spot in the neutral state to a spot in the on/off-state in a case of a pattern of which an accumulated light amount is insufficient as compared with a reference value among the patterns disposed on the substrate 100 based on the accumulated light amount data to increase the accumulated light amount of the corresponding pattern. The control unit 3000 may control some of the on/off-spots not to be in the on-state even when the on/off-spot overlaps a corresponding spot in a case of a pattern of which an accumulated light amount exceeds the reference value among the patterns disposed on the substrate 100 to decrease the accumulated light amount of the corresponding pattern. In this manner, the control unit 3000 may generate a new exposure pattern by determining a state of the beam in the scan process (SS3). The control unit 3000 may control the light modulator 1300 of the exposure head 1000 based on the exposure pattern. When the control of the light modulator 1300 is completed, exposure of the substrate 100 may be performed (SS4). That is, the light modulator 1300 may modulate the exposure beam 1150 based on the exposure pattern. It has been described that the control unit 3000 generates the exposure pattern based on the light amount, but the present disclosure is not limited thereto. For example, the control unit 3000 may use various criteria such as an accumulated illuminance rather than the accumulated light amount.

Figure 6:
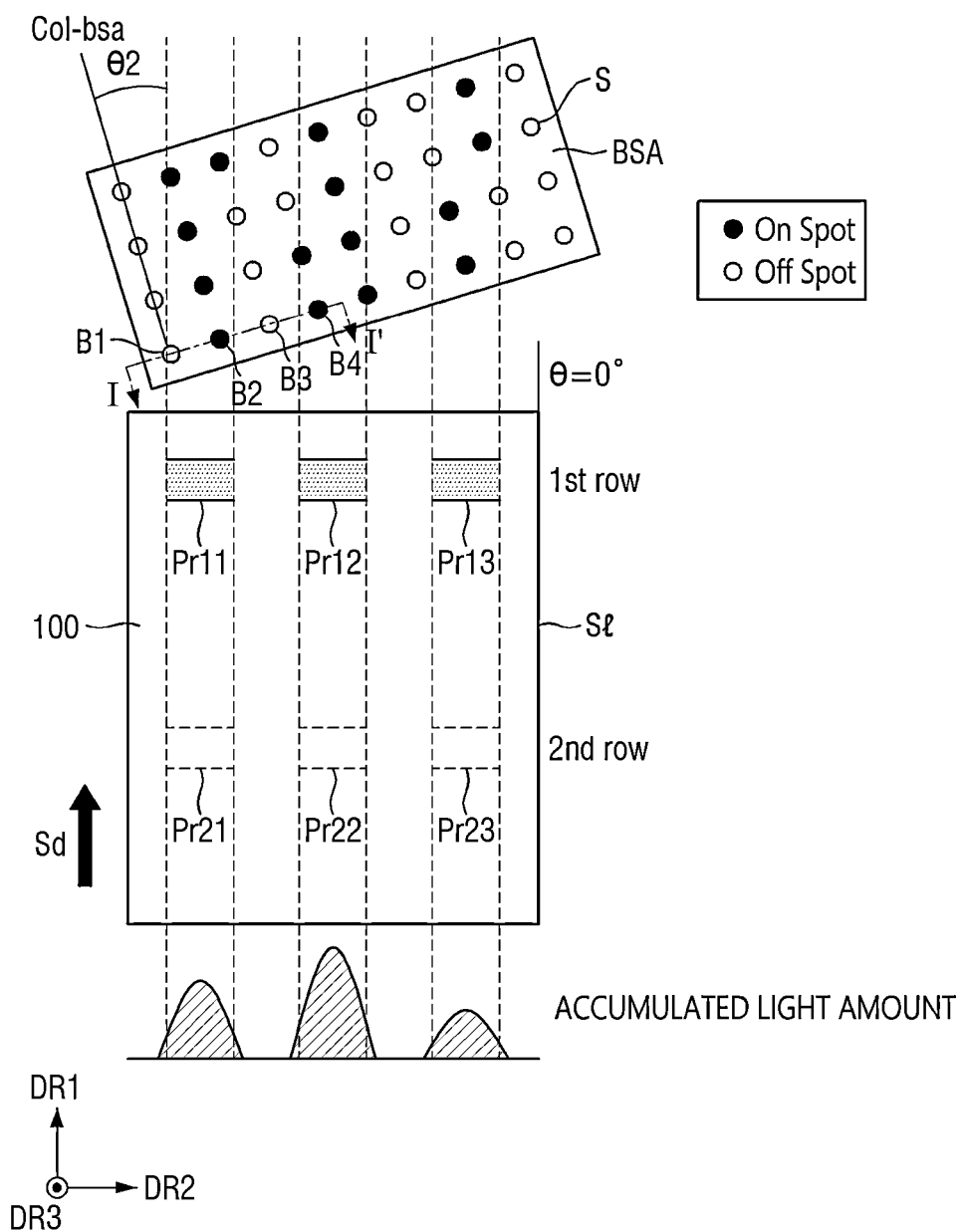
FIG. 6 is a conceptual diagram illustrating an exposure process through a conventional maskless exposure device.
Figure 7:
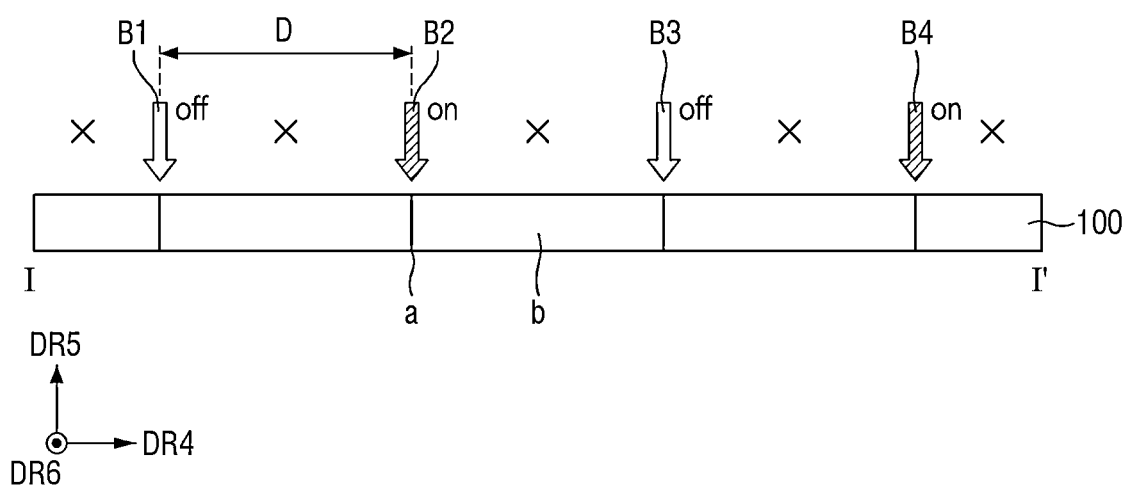
FIG. 7 is a schematic conceptual diagram of line I-I' of FIG. 6 viewed from the side.

FIG. 6 is a conceptual diagram illustrating an exposure process through a conventional maskless exposure device. FIG. 7 is a schematic conceptual diagram of line I-I' of FIG. 6 viewed from the side (i.e., cross-sectional view).

Referring to FIG. 6, for convenience of explanation, it is assumed that shapes of patterns to be formed on the substrate 100 are substantially the same as each other in the respective rows and are substantially the same as each other in the respective columns.

In the conventional maskless exposure device, the substrate 100 may be disposed on the stage 20 so that a side St thereof extends parallel to the scan direction Sd, that is, an angle θ between the side St and the scan direction Sd is 0°. In addition, a column Col-bsa of a beam spot array BSA may have a second angle θ2 with respect to the scan direction Sd. In a case of such an arrangement, the same patterns of the same row, for example, first patterns Pr11, Pr12, and Pr13 of a first row, have the same shape, but the numbers of on-spots used in the beam spot array BSA may be different from each other. For example, as can be seen in FIG. 6, five beam spots S may be used as on-spots for exposure of the first pattern Pr11 on the left side of the first row, six beam spots S may be used as on-spots for exposure of the first pattern Pr12 in the middle of the first row, and four beam spots S may be used as on-spots for exposure of the first pattern Pr13 on the right side of the first row.

Accordingly, as illustrated in a lower portion of FIG. 6, light amounts accumulated by the beam spots in each of the patterns Pr11, Pr12, and Pr13 of the first row may be different from each other. For example, the light amount accumulated in the first pattern Pr12 in the middle may be the greatest, and the light amount accumulated in the first pattern Pr13 on the right side may be the smallest. Since the substrate 100 is disposed to be aligned with the scan direction Sd, accumulated light amount for a second row may also be the same as the first row. Instead of the accumulated light amount, an accumulated illuminance may also be used as the same meaning as the accumulated light amount.

Referring to FIG. 7, light irradiated onto the substrate 100 may be incident on alignment points a and may not be incident on out-of-alignment points b. Light of which a traveling path overlaps the alignment point a may be adjusted to the on/off-states, and light of which a traveling path overlaps the out-of-alignment point b may be adjusted to the neutral state. That is, first to fourth spots B1, B2, B3, and B4 of FIG. 7 may be first to fourth spots of FIG. 6, respectively.

The first to fourth spots B1, B2, B3, and B4 have one state of the on-state or the off-state. As the stage 20 moves in the scan direction Sd, spots of which light overlaps the pattern on the substrate 100 among the first to fourth spots B1, B2, B3, and B4 are adjusted to on-spots, and spots of which light does not overlap the pattern on the substrate 100 among the first to fourth spots B1, B2, B3, and B4 are adjusted to off-spots. The light in the neutral state may be adjusted so as not to reach the substrate 100 regardless of whether or not the light in the neutral state overlaps the pattern on the substrate 100 in the scan process.

The first to fourth spots B1, B2, B3, and B4 are spaced apart by the same distance respectively, and a distance between two adjacent spots is defined as D. That is, a distance between an alignment point a and an adjacent alignment point a is defined as D.

Figure 8:
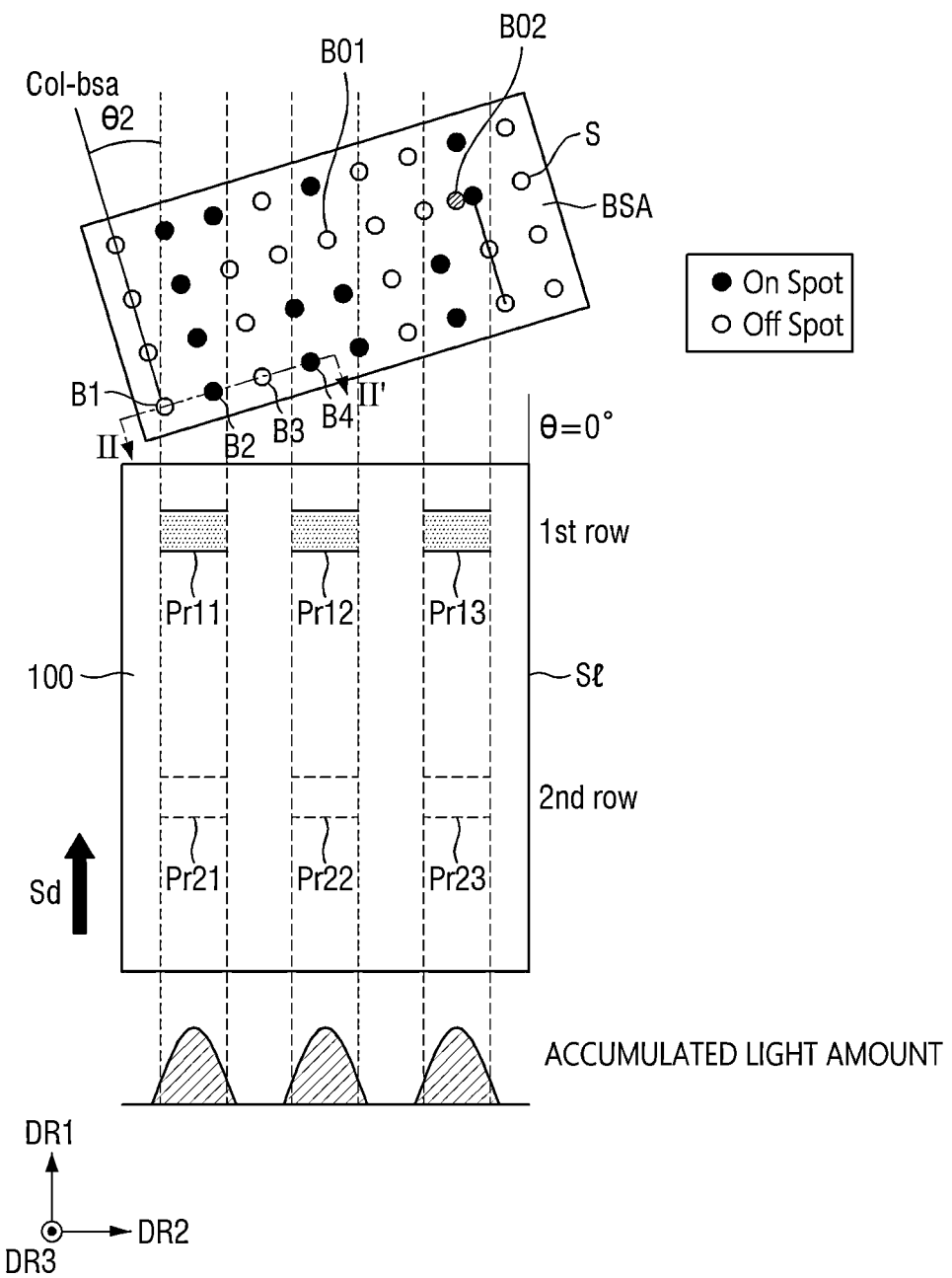
FIG. 8 is a conceptual diagram illustrating an exposure process through the maskless exposure device according to an embodiment.
Figure 9:
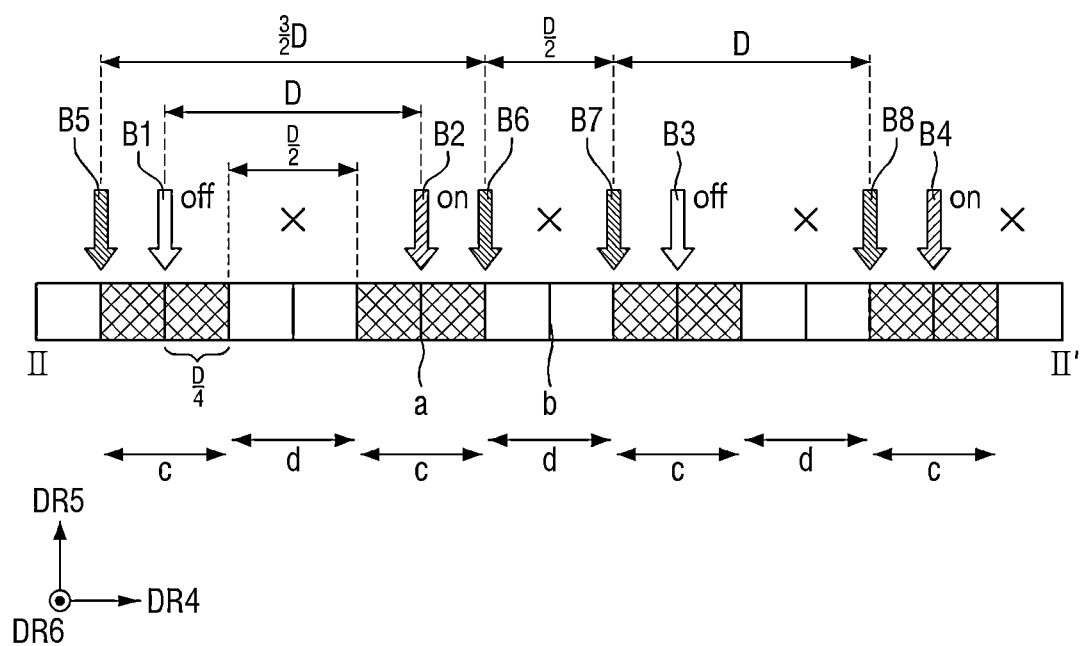
FIG. 9 is a schematic conceptual diagram of line II-IF of FIG. 8 viewed from the side.
Figure 10:
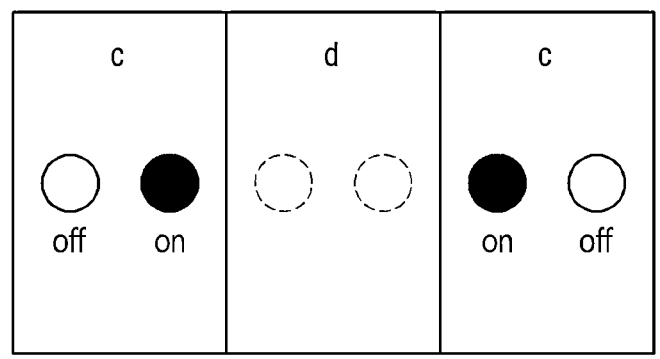
FIG. 10 is a conceptual diagram of an alignment area and an out-of-alignment area.

FIG. 8 is a conceptual diagram illustrating an exposure process through the maskless exposure device according to an embodiment. FIG. 9 is a schematic conceptual diagram of line II-IF of FIG. 8 viewed from the side. FIG. 10 is a conceptual diagram of an alignment area and an out-of-alignment area.

Hereinafter, contents different from those of the maskless exposure device described above with reference to FIGS. 6 and 7 will be mainly described.

Referring to FIG. 8, the maskless exposure device according to an embodiment classifies a state of light based on a specific area rather than a specific point. The beam spot array BSA includes alignment areas c and out-of-alignment areas d. The alignment areas c may have a width of D/2 in cross-sectional view, and alignment areas c adjacent to each other may be spaced apart by D/2. A center point of the alignment area c may be the alignment point a. In this embodiment, spots where traveling paths overlap the alignment points a among a plurality of spots are on/off-spots, and spots where traveling paths overlap the out-of-alignment points b among the plurality of spots may be adjusted to a neutral state. That is, the maskless exposure device according to an embodiment may control more lights to the on/off-states as compared with a device adjusting only lights of which traveling paths overlap the alignment points a among a plurality of lights to the on/off-states. Accordingly, an effect of increasing the total number of spots may be obtained.

Referring to FIGS. 8 and 9, first to fourth spots B1, B2, B3, and B4 may be the same as the first to fourth spots B1, B2, B3 and B4 of FIG. 6, respectively. A fifth spot B5 does not overlap the alignment point a, but overlaps the alignment area c. Accordingly, the fifth spot B5 may be adjusted to an on/off-spot. Likewise, a sixth spot B6, a seventh spot B7, and an eighth spot B8 do not overlap the alignment points a, but may overlap the alignment areas c to be adjusted to on/off-spots in the maskless exposure device according to an embodiment. The fifth spot B5 is a spot disposed on the leftmost side within an alignment area c in FIG. 9, and the sixth spot B6 is a spot disposed on the rightmost side in an alignment area c adjacent to the alignment area c in which the fifth spot B5 is disposed. Accordingly, a distance between the fifth spot B5 and the sixth spot B6 may be 3D/2. That is, a maximum value of a distance between adjacent on/off-spots may be 3D/2. A seventh spot B7 is disposed in an alignment area c disposed adjacent to the alignment area c in which the sixth spot B6 is disposed, in a fourth direction DR4, and is disposed on the leftmost side within the corresponding alignment area c in FIG. 9. Accordingly, a distance between the sixth spot B6 and the seventh spot B7 may be D/2. That is, a minimum value of a distance between on/off-spots disposed in adjacent alignment areas c may be D/2. A distance D between the alignment points a may be different for each device. Accordingly, a distance between the on/off-spots adjacent to each other may be about 0.01 micrometers (μm) to about 1.0 μm.

As illustrated in FIGS. 9 and 10, the alignment areas c and the out-of-alignment areas d may be alternately disposed along the fourth direction DR4.

Referring to FIG. 8 again, as described above, the number of on/off-spots in the beam spot array BSA may be increased by adjusting the spots disposed in the alignment areas c to the on/off-spots. That is, a second change spot B02 is not an on/off-spot in an initial state, but may be a spot adjusted to the on/off-spot by the control unit 3000 as described above. Accordingly, the number of on/off-spots of FIG. 8 may be one more than the number of on/off-spots of FIG. 6. Accumulated light amounts of the first pattern Pr13 in the right side of the first row and the second pattern Pr23 in the right side of the second row may be increased by adjusting the second change spot B02 to the on/off-spot.

In FIGS. 6 to 8, a time point at which the accumulated light amount for each pattern occurs may be referred to as a first point in time, and the time point at which the control unit 3000 additionally adjusts the state and number of on-off spots based on the deviation of the accumulated light amount for each pattern may be referred to as a second point in time. In some embodiments, a distance between adjacent on-off spots at a first point in time may be different from a distance between adjacent on-off spots at a second point in time.

A first change spot B01 overlaps the first pattern Pr12 in the middle of the first row and the second pattern Pr22 in the middle of the second row in the scan process, but the control unit 3000 may control the first change spot B01 so as not to be in an on-state even when the first change spot B01 overlaps the first pattern Pr12 in the middle of the first row and the second pattern Pr22 in the middle of the second row. That is, accumulated light amounts of the first pattern Pr12 in the middle of the first row and the second pattern Pr22 in the middle of the second row may be decreased by maintaining the first change spot B01 in an off-state. As such, the control unit 3000 controls each spot, such that a deviation between the accumulated light amounts of the patterns disposed on the substrate 100 may be decreased. Accordingly, it is possible to effectively prevent a diagonal pattern or the like (e.g., oblique stain) due to a difference in the accumulated light amounts of light irradiated to the patterns, or the like.

Referring to FIG. 10, a plurality of on/off-spots may be disposed in the alignment area c, and each on/off-spot may be controlled to be in an on-state or an off-state. The on/off-spot may be controlled to be in the on-state when the on/off-spot overlaps the pattern disposed on the substrate 100 and be controlled to be in the off-state when the on/off-spot does not overlap the pattern. In addition, the control unit 3000 may additionally adjust states and the number of on/off-spots in order to decrease the deviation between the accumulated light amounts for each pattern. Spots disposed in the out-of-alignment area d are in a neutral state rather than an on-state and an off-state, and the substrate 100 is not irradiated with light. In other words, in a case of the out-of-alignment area d, the substrate 100 is not irradiated with the light regardless of whether or not the spot overlaps with the pattern. The maskless exposure device according to an embodiment may adjust the number and the state of on/off-spots as described above to attempt to make beam positions random and decrease the deviation between the accumulated light amounts for each pattern disposed on the substrate 100, thereby effectively alleviating an exposure stain.

Figure 11:
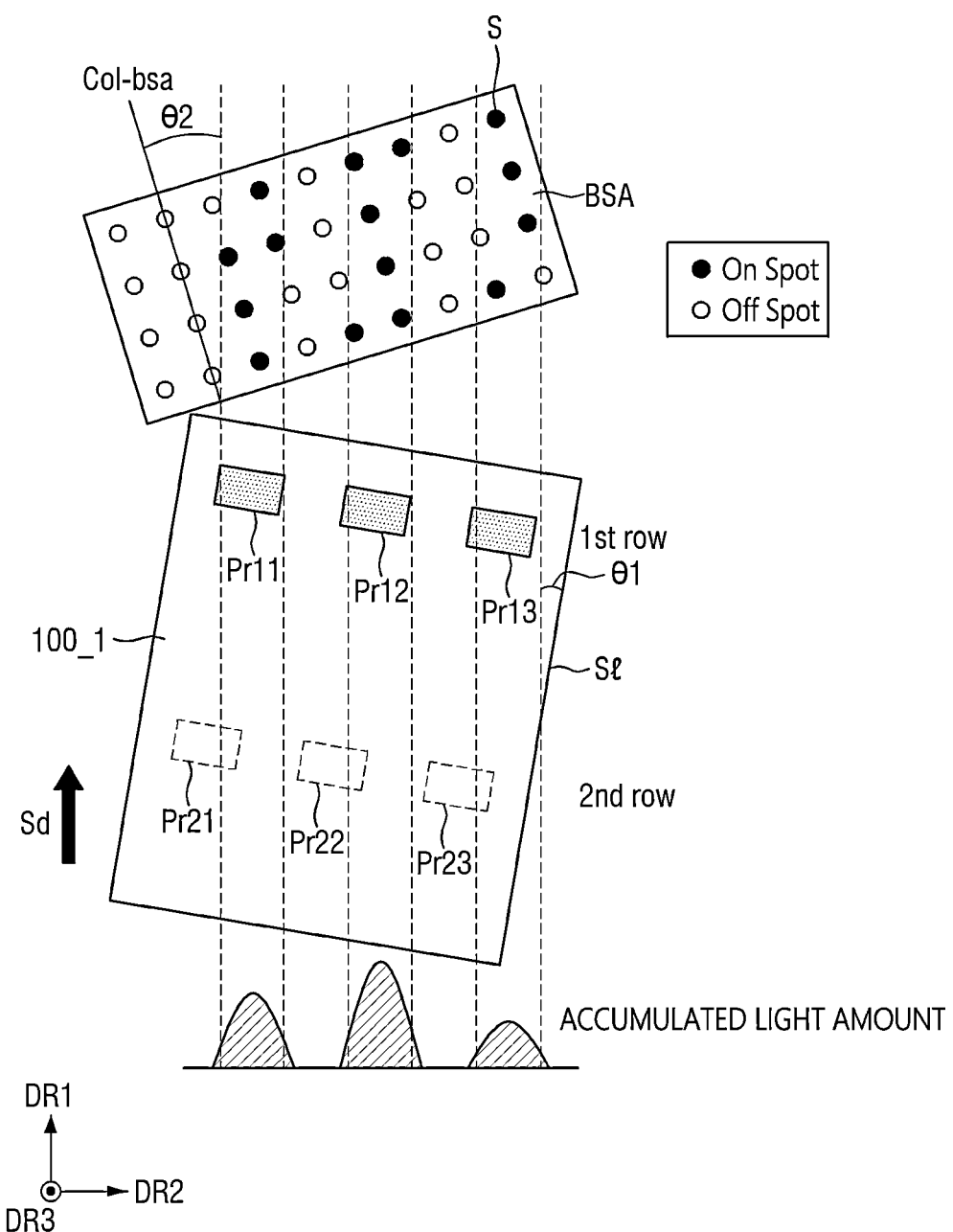
FIGS. 11 and 12 are conceptual diagrams illustrating an exposure process through a maskless exposure device according to another embodiment.
Figure 12:
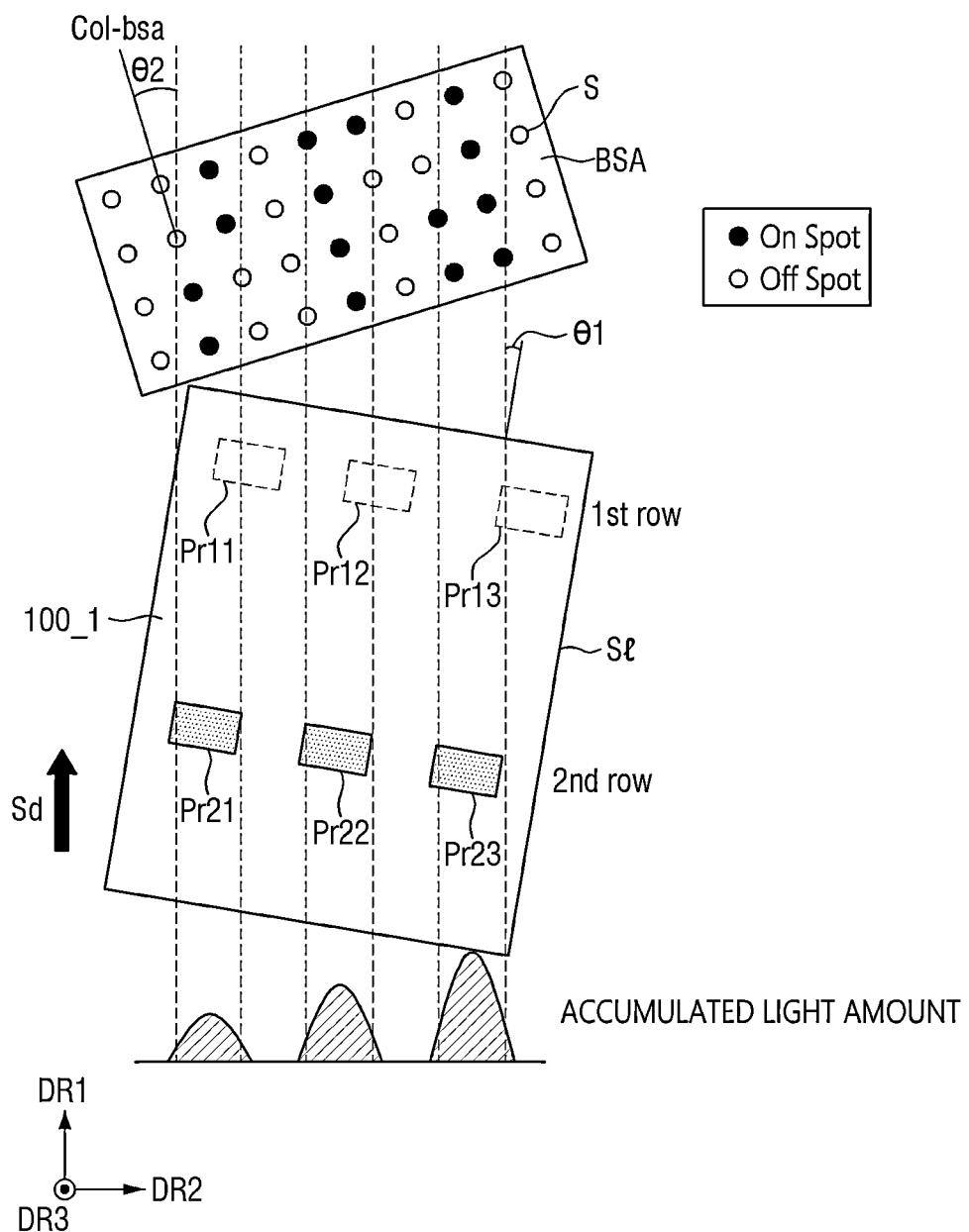

FIGS. 11 and 12 are conceptual diagrams illustrating an exposure process through a maskless exposure device according to another embodiment.

In a maskless exposure device according to the present embodiment, a substrate 100_1 may be disposed on the stage 20 so that a side St thereof has a first angle θ1 with respect to the scan direction Sd. Here, the first angle θ1 may be within the range of ±1°. However, the first angle θ1 is not limited to the numerical value described above. In addition, a column Col-bsa of a beam spot array BSA may have a second angle θ2 with respect to the scan direction Sd. Also, in a case of such an arrangement, first patterns Pr11, Pr12, and Pr13 of a first row have the same shape, but the numbers of on-spots used in the beam spot array BSA may be different from each other. For example, as can be seen in FIG. 11, five beam spots S may be used as on-spots for exposure of the first pattern Pr11 on the left side of the first row, six beam spots S may be used as on-spots for exposure of the first pattern Pr12 in the middle of the first row, and four beam spots S may be used as on-spots for exposure of the first pattern Pr13 on the right side of the first row.

Accordingly, as illustrated in a lower portion of FIG. 11, light amounts accumulated by the beam spots in each of the first patterns Pr11, Pr12, and Pr13 of the first row may be different from each other. For example, the light amount accumulated in the first pattern Pr12 in the middle may be the greatest, and the light amount accumulated in the first pattern Pr13 on the right side may be the smallest.

Referring to FIG. 12, it is assumed that a scan is performed along the scan direction Sd. For example, it is assumed that exposure of second patterns Pr21, Pr22, and Pr23 of a second row of the substrate 100_1 is performed by the movement of the stage 20 in the scan direction Sd.

In a case of the maskless exposure device according to the present embodiment, the side Sf of the substrate 100_1 has the first angle θ1 with respect to the scan direction Sd, such that beam spots S used for exposure of the second patterns Pr21, Pr22, and Pr23 of the second row may be different from beam spots S used for exposure of the first patterns Pr11, Pr12, and Pr13 of the first row. For example, as can be seen in FIG. 12, four beam spots S may be used as on-spots for exposure of the second pattern Pr21 on the left side of the second row, five beam spots S may be used as on-spots for exposure of the second pattern Pr22 in the middle of the second row, and six beam spots S may be used as on-spots for exposure of the second pattern Pr23 on the right side of the second row.

Accordingly, light amounts accumulated by the beam spots S in each of the patterns Pr21, Pr22, and Pr23 of the second row may be different from light amounts accumulated by the beam spots S in each of the patterns Pr11, Pr12, and Pr13 of the corresponding first row. For example, the light amount accumulated in the second pattern Pr23 on the right side may be the greatest, and the light amount accumulated in the second pattern Pr21 on the left side may be the smallest.

Figure 13:
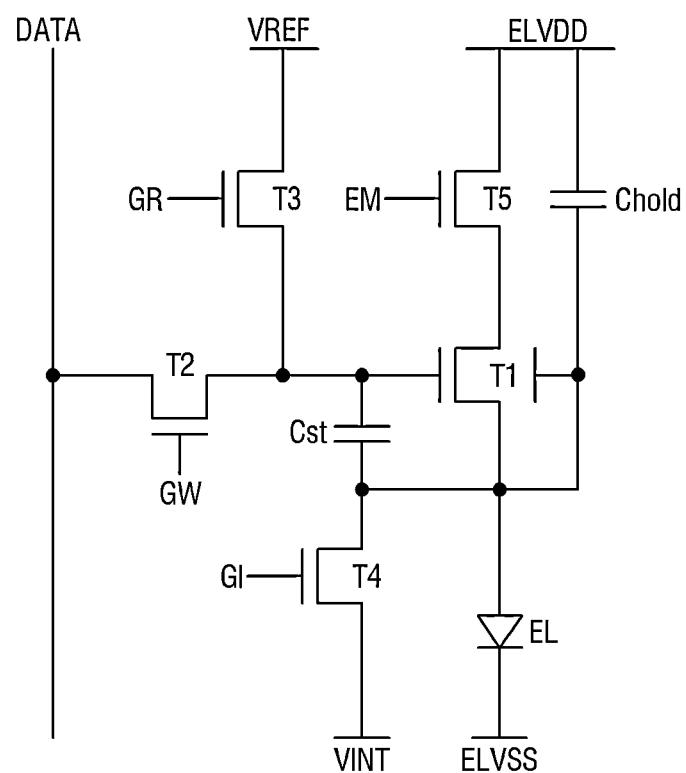
FIG. 13 is a circuit diagram illustrating, in detail, a sub-pixel of a display device manufactured by the maskless exposure device according to another embodiment.

FIG. 13 is a circuit diagram illustrating, in detail, a sub-pixel of a display device manufactured by the maskless exposure device according to another embodiment.

Referring to FIG. 13, a sub-pixel SP may include five transistors T1 to T5, a storage capacitor Cst, a hold capacitor Chold, and a light emitting element ("EL"), but is not limited thereto. For example, the sub-pixel may include one transistor or a plurality of transistors. Hereinafter, for convenience of explanation of a shape of an edge of a semiconductor layer SEM or a gate electrode, it is assumed that the sub-pixel includes five transistors T1 to T5.

A first electrode D1 of a first transistor T1 may be connected to a second electrode S5 of a fifth transistor T5, and a second electrode S1 of the first transistor T1 may be connected to an anode electrode of the light emitting element (EL), a first electrode D4 of a fourth transistor T4, and a first light blocking layer BML1. A first-first gate electrode of the first transistor T1 may be connected to a first electrode D3 of a third transistor T3 and a second electrode S2 of a second transistor T2.

A data voltage DATA may be applied to a first electrode D2 of the second transistor T2, and the second electrode S2 of the second transistor T2 may be connected to the first electrode D3 of the third transistor T3 and the first-first gate electrode of the first transistor T1. A second control signal GW may be applied to a second gate electrode G2 of the second transistor T2. The second transistor T2 may be turned on by the second control signal GW to serve as a path through which the data voltage DATA may be applied to the first-first gate electrode G1-1 of the first transistor T1.

The first electrode D3 of the third transistor T3 may be connected to the second electrode S2 of the second transistor T2 and the first-first gate electrode G1-1 of the first transistor T1. A reference voltage VREF may be applied to a second electrode S3 of the third transistor T3, and a first control signal GR may be applied to a third gate electrode G3 of the third transistor T3. The third transistor T3 may be turned on by the first control signal GR to serve as a path through which the reference voltage VREF may be applied to the first-first gate electrode G1-1 of the first transistor T1.

The first electrode D4 of the fourth transistor T4 may be connected to the anode electrode of the light emitting element (EL) and the second electrode S1 and the first light blocking layer BML1 of the first transistor T1. An initialization voltage VINT may be applied to a second electrode S4 of the fourth transistor T4, and a third control signal GI may be applied to a fourth gate electrode G4 of the fourth transistor T4. The fourth transistor T4 may be turned on by the third control signal GI to serve as a path through which the initialization voltage VINT may be applied to the second electrode S1 of the first transistor T1.

A source voltage ELVDD may be applied to a first electrode D5 of the fifth transistor T5, and the second electrode S5 of the fifth transistor T5 may be connected to the first electrode D1 of the first transistor T1. An emission control signal EM may be applied to a fifth gate electrode G5 of the fifth transistor T5. The fifth transistor T5 may be turned on by the emission control signal EM to serve as a path through which the source voltage ELVDD may be applied to the first electrode D1 of the first transistor T1.

The first transistor T1 may be a driving transistor, and the first electrodes of the first to fifth transistors T1, T2, T3, T4, and T5 may be drain electrodes and the second electrodes of the first to fifth transistors T1, T2, T3, T4, and T5 may be source electrodes, but the present disclosure is not limited thereto.

It has been mainly illustrated in FIG. 13 that the first to fifth transistors T1, T2, T3, T4, and T5 are formed as N-channel metal oxide semiconductor field effect transistors ("MOSFETs"), but the present disclosure is not limited thereto, and the first to fifth transistors T1, T2, T3, T4, and T5 may also be formed as P-channel MOSFETs.

The first transistor T1 controls a drain-source current (hereinafter, referred to as a "driving current") according to the data voltage DATA applied to the gate electrode thereof.

The light emitting element (EL) emits light according to the driving current. An amount of light emitted from the light emitting element (EL) may be proportional to the driving current.

The light emitting element (EL) may be an organic light emitting diode including an anode electrode, a cathode electrode, and an organic light emitting layer is disposed between the anode electrode and the cathode electrode. Alternatively, the light emitting element (EL) may be an inorganic light emitting element (EL) including an anode electrode, a cathode electrode, and an inorganic semiconductor disposed between the anode electrode and the cathode electrode. Alternatively, the light emitting element (EL) may be a quantum dot light emitting element (EL) including an anode electrode, a cathode electrode, and a quantum dot light emitting layer disposed between the anode electrode and the cathode electrode. Alternatively, the light emitting element (EL) may be a micro light emitting diode.

The anode electrode of the light emitting element (EL) may be connected to the first electrode D4 of the fourth transistor T4 and the second electrode S1 of the first transistor T1, and a ground voltage ELVSS may be applied to the cathode electrode of the light emitting element (EL).

A first electrode of the storage capacitor Cst is connected to the first-first gate electrode G1-1 of the first transistor T1, and a second electrode of the storage capacitor Cst is connected to a first-second gate electrode G1-2 of the first transistor T1. The storage capacitor Cst may serve to store the data voltage DATA transferred by the second transistor T2, but is not limited thereto.

The source voltage ELVDD may be applied to a first electrode of the hold capacitor Chold, and the second electrode may be connected to the first light blocking layer BML1 of the first transistor T1. The hold capacitor Chold may prevent a voltage difference between the source voltage ELVDD and the first light blocking layer BML1 of the first transistor T1 from being rapidly changed.

Figure 14:
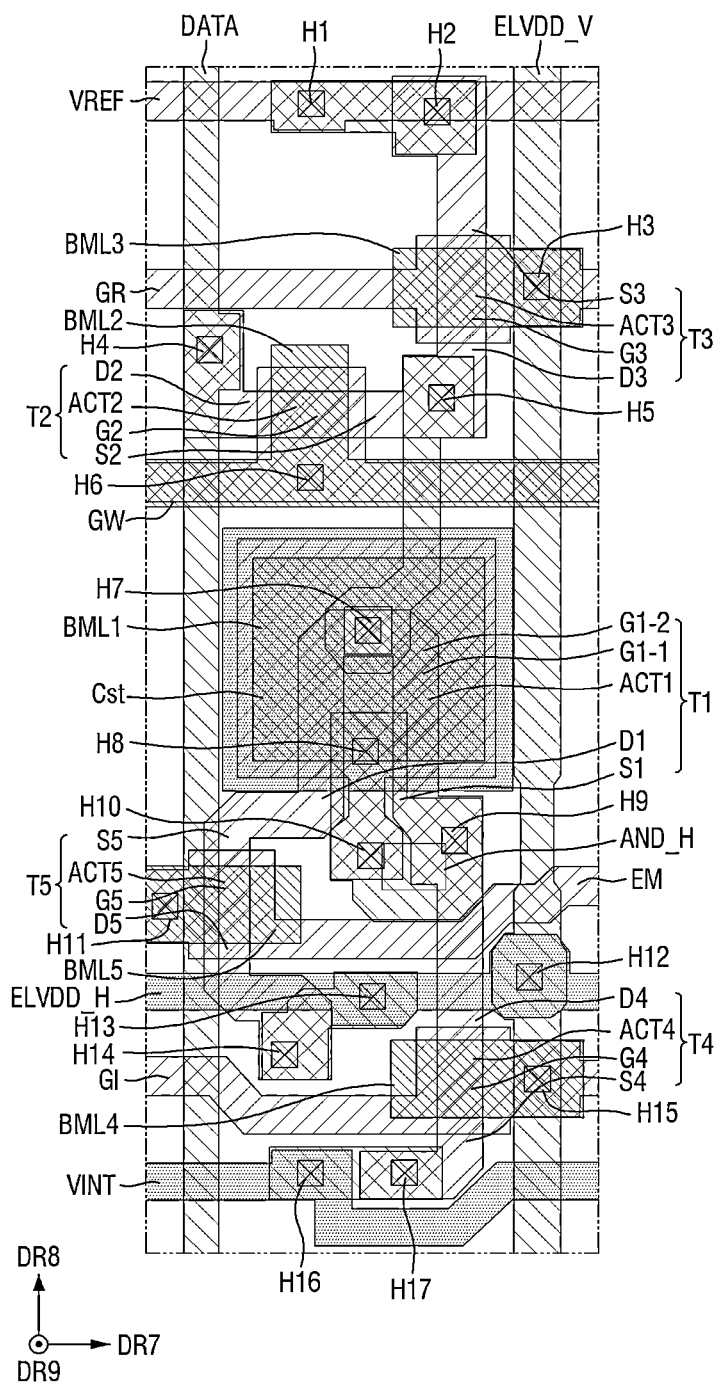
FIG. 14 is a plan view illustrating sub-pixels according to an embodiment in detail.
Figure 15:
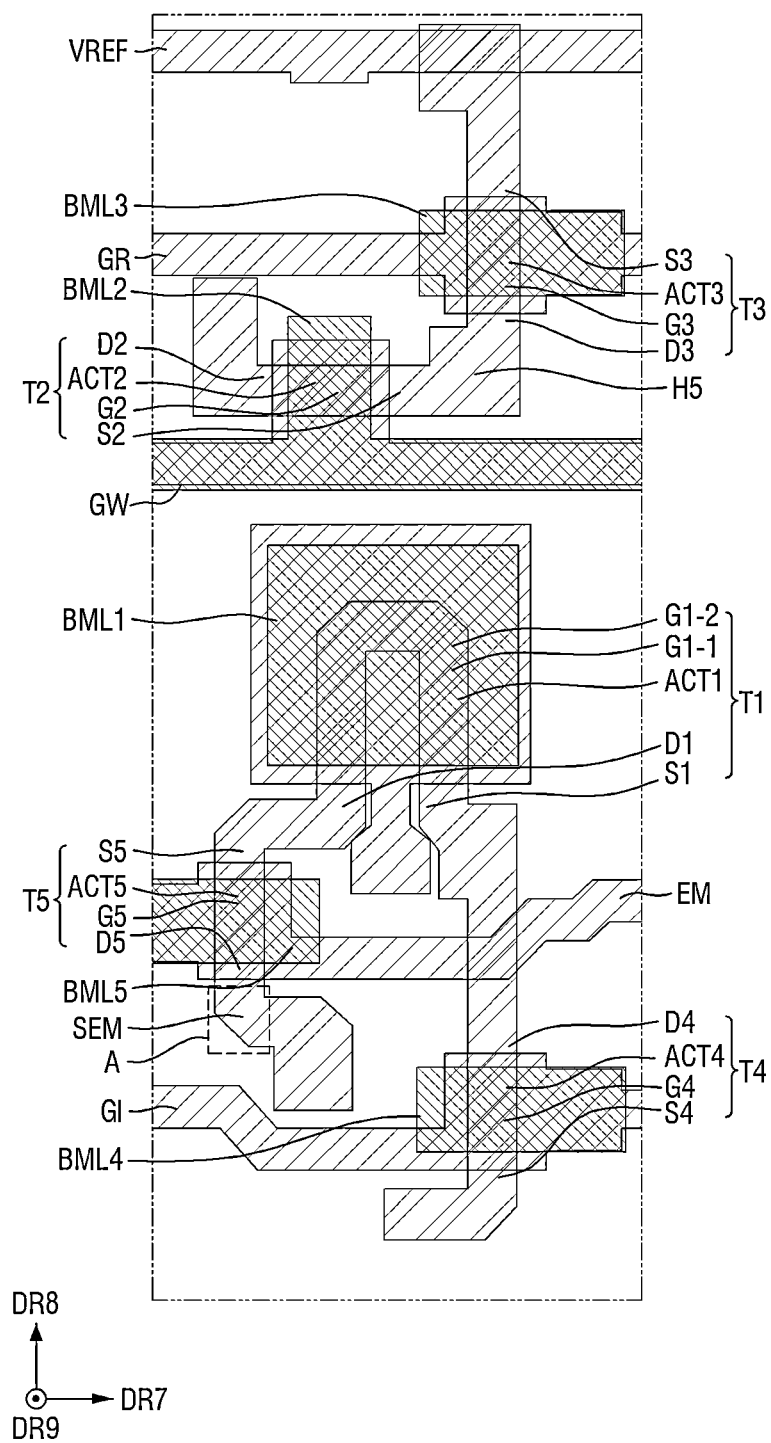
FIG. 15 is a plan view illustrating a light blocking layer, a semiconductor layer, and a gate layer in the plan view of FIG. 14.

FIG. 14 is a plan view illustrating sub-pixels according to an embodiment in detail. FIG. 15 is a plan view illustrating a light blocking layer, a semiconductor layer, and a gate layer in the plan view of FIG. 14.

Referring to FIG. 14, the sub-pixel SP may include first to fifth transistors T1, T2, T3, T4, and T5. A semiconductor layer SEM includes a first electrode, a second electrode, and an active layer of each transistor.

The first transistor T1 may include a first active layer ACT1, a first electrode D1 of the first transistor T1, a second electrode S1 of the first transistor T1, a first-first gate electrode G1-1, and a first-second gate electrode G1-2. The first active layer ACT1 of the first transistor T1, the first electrode D1 of the first transistor T1, and the second electrode S1 of the first transistor T1 may be formed on the same plane, and the first active layer may overlap the first-first gate electrode G1-1. The first-second gate electrode G1-2 may be disposed on the first-first gate electrode G1-1. The 1-first-first gate electrode G1-1 may overlap the first active layer ACT1, and the first electrode D1 of the first transistor T1 may be connected to a second electrode S5 of the fifth transistor T5. The second electrode S1 of the first transistor T1 may be connected to a first electrode D4 of the fourth transistor T4, and may be connected to a connection electrode VIE through a ninth contact hole.

The second transistor T2 may include a second active layer ACT2, a first electrode D2 of the second transistor T2, a second electrode S2 of the second transistor T2, and a second gate electrode G2. The second active layer ACT2 of the second transistor T2, the first electrode D2 of the second transistor T2, and the second electrode S2 of the second transistor T2 may be formed on the same plane, and the second active layer may overlap the second gate electrode G2. The second gate electrode G2 may overlap the second active layer ACT2, and the first electrode D2 of the second transistor T2 may be connected to a data line DL through a fourth contact hole. The second electrode S2 of the second transistor T2 may be connected to a first electrode D3 of the third transistor T3, and may be connected to the connection electrode VIE through a fifth contact hole.

The third transistor T3 may include a third active layer ACT3, the first electrode D3 of the third transistor T3, a second electrode S3 of the third transistor T3, and a third gate electrode G3. The third active layer ACT3 of the third transistor T3, the first electrode D3 of the third transistor T3, and the second electrode S3 of the third transistor T3 may be formed on the same plane, and the third active layer may overlap the third gate electrode G3. The third gate electrode G3 may overlap the third active layer ACT3, and the first electrode D3 of the third transistor T3 may be connected to the second electrode S2 of the second transistor T2 and may be connected to the connection electrode VIE through the fifth contact hole. The second electrode S3 of the third transistor T3 may be connected to the connection electrode VIE through a second contact hole.

The fourth transistor T4 may include a fourth active layer ACT4, the first electrode D4 of the fourth transistor T4, a second electrode S4 of the fourth transistor T4, and a fourth gate electrode G4. The fourth active layer ACT4 of the fourth transistor T4, the first electrode D4 of the fourth transistor T4, and the second electrode S4 of the fourth transistor T4 may be formed on the same plane, and the fourth active layer may overlap the fourth gate electrode G4. The fourth gate electrode G4 may overlaps the fourth active layer ACT4, and the first electrode D4 of the fourth transistor T4 may be connected to the second electrode S1 of the first transistor T1 and may be connected to the connection electrode VIE through the ninth contact hole. The second electrode S4 of the fourth transistor T4 may be connected to the connection electrode VIE through a seventeenth contact hole.

The fifth transistor T5 may include a fifth active layer ACT5, a first electrode D5 of the fifth transistor T5, the second electrode S5 of the fifth transistor T5, and a fifth gate electrode G5. The fifth active layer ACT5 of the fifth transistor T5, the first electrode D5 of the fifth transistor T5, and the second electrode S5 of the fifth transistor T5 may be formed on the same plane, and the fifth active layer may overlap the fifth gate electrode G5. The fifth gate electrode G5 may overlap the fifth active layer ACT5, and the first electrode D5 of the fifth transistor T5 may be connected to the connection electrode VIE through a fourteenth contact hole. The second electrode S5 of the fifth transistor T5 may be connected to the first electrode D1 of the first transistor T1.

A first contact hole may connect the connection electrode VIE disposed on the upper side and a reference voltage VREF line disposed on the lower side to each other. The second contact hole may connect the connection electrode VIE disposed on the upper side and the second electrode S3 of the third transistor T3 disposed on the lower side to each other. A third contact hole may connect a first control signal GR line disposed on the upper side and a third light blocking layer BML3 disposed on the lower side to each other. The fourth contact hole may connect a data voltage DATA line disposed on the upper side and the first electrode D2 of the second transistor T2 disposed on the lower side to each other. The fifth contact hole may connect the connection electrode VIE disposed on the upper side and the second electrode S2 of the second transistor T2 and the first electrode D3 of the third transistor T3 disposed on the lower side to each other. A sixth contact hole may connect a second control signal GW line disposed on the upper side and a second light blocking layer BML2 disposed on the lower side to each other. A seventh contact hole may connect the connection electrode VIE disposed on the upper side and the first-first gate electrode G1-1 of the first transistor T1 disposed on the lower side to each other. An eighth contact hole may connect the connection electrode VIE disposed on the upper side and the reference voltage VREF line disposed on the lower side to each other. The ninth contact hole may connect the connection electrode VIE disposed on the upper side and the second electrode S1 of the first transistor T1 and the first electrode D4 of the fourth transistor T4 disposed on the lower side to each other. A tenth contact hole may connect the connection electrode VIE disposed on the upper side and the first-first gate electrode G1-1 of the first transistor T1 disposed on the lower side to each other. An eleventh contact hole may connect an emission control signal EM line disposed on the upper side and a fifth light blocking layer BML5 disposed on the lower side to each other. A twelfth contact hole may connect a horizontal source voltage ELVDD_H (FIG. 14) line ELVDDL disposed on the upper side and a vertical source voltage ELVDD_V (FIG. 14) line ELVDDL disposed on the lower side to each other. A thirteenth contact hole may connect the connection electrode VIE disposed on the upper side and the horizontal source voltage ELVDD line ELVDDL disposed on the lower side to each other. The fourteenth contact hole may connect the connection electrode VIE disposed on the upper side and the fifth electrode D5 of the fifth transistor T5 disposed on the lower side to each other. A fifteenth contact hole may connect a third control signal GI line disposed on the upper side and a fourth light blocking layer BML4 disposed on the lower side to each other. A sixteenth contact hole may connect the connection electrode VIE disposed on the upper side and an initialization voltage VINT line disposed on the lower side to each other. The seventeenth contact hole may connect the connection electrode VIE disposed on the upper side and the second electrode S4 of the fourth transistor T4 disposed on the lower side to each other.

When the second transistor T2 is turned on, the data voltage DATA may be applied to the 1-1 gate electrode G1-1, and the same voltage as a voltage applied to the first-first gate electrode G1-1 may be applied to the first light blocking layer BML1 through the eighth contact hole, the tenth contact hole, and the connection electrode VIE.

The second control signal GW may be applied to the second gate electrode G2, and may also be applied to the second light blocking layer BML2. The first control signal GR may be applied to the third gate electrode G3, and may also be applied to the third light blocking layer BML3. The third control signal GI may be applied to the fourth gate electrode G4, and may also be applied to the fourth light blocking layer BML4. The emission control signal EM may be applied to the fifth gate electrode G5, and may also be applied to the fifth light blocking layer BML5. That is, the same voltage as the voltage applied to the gate electrode to each light blocking layer, and thus, the first to fifth transistors T1, T2, T3, T4, and T5 may be formed in a double gate manner in which gates are positioned on above and below the active layer. In other words, the light blocking layer disposed at a lower portion of each transistor may serve not only as a light blocking layer but also as a gate. The present disclosure has been described on the premise that the first to fifth transistors T1, T2, T3, T4, and T5 are formed in the double gate manner, but is not limited thereto.

The first electrode, the active layer, and the second electrode of each of the first to fifth transistors T1, T2, T3, T4, and T5 may include an oxide semiconductor. The oxide semiconductor may include at least one of unary metal oxide such as indium oxide (In), tin oxide (Sn), or zinc oxide (Zn); binary metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide; ternary metal oxide such as In—Ga—Zn-based oxide, In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide; and quaternary metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide. For example, the oxide semiconductor may include indium-gallium-zinc oxide ("IGZO") among the In—Ga—Zn-based oxides.

Figure 16:
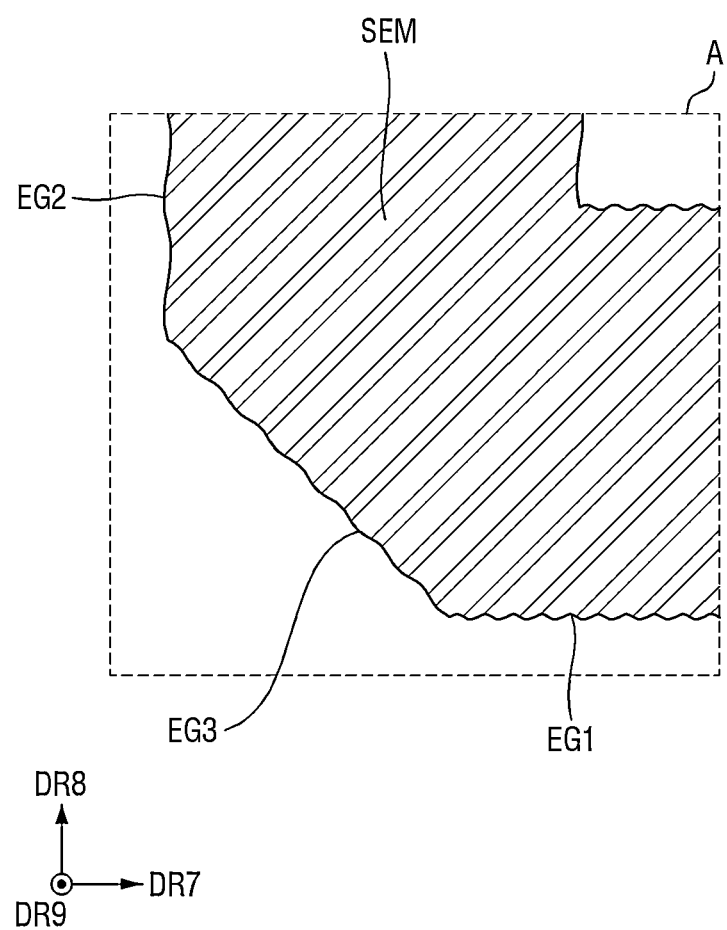
FIG. 16 is an enlarged view of area A of FIG. 15.

FIG. 16 is an enlarged view of area A of FIG. 15.

Referring to FIG. 16, the semiconductor layer SEM includes a first edge EG1 extending along a seventh direction DR7, a second edge EG2 extending along an eighth direction DR8, and a third edge EG3 extending in a direction crossing the seventh direction DR7 and the eighth direction DR8. All of the first edge EG1, the second edge EG2, and the third edge EG3 may have line edge roughnesses.

When the substrate 100 is exposed through the maskless exposure device, a difference in line edge roughness may appear according to a direction in which an exposure target extends. For example, a portion extending along a direction that is parallel to the scan direction Sd may not have a line edge roughness, but a portion extending along a direction that is not parallel to the scan direction Sd may have a line edge roughness. In addition, according to an angle difference between the scan direction Sd and the direction in which the exposure target extends, magnitudes of line edge roughnesses of the respective exposure targets may be different from each other.

In a case of the maskless exposure device according to another embodiment, as described above, the substrate 100 is disposed at a predetermined angle with respect to the scan direction Sd so as not to be parallel to the scan direction Sd. Therefore, the first edge EG1 and the second edge EG2 parallel or perpendicular to each axis of the substrate 100 may be not parallel to the scan direction Sd, and the third edge EG3 arranged in a direction crossing directions in which the first edge EG1 and the second edge EG2 are arranged may also not be parallel to the scan direction Sd. Accordingly, as illustrated in FIG. 16, all of the first edge EG1, the second edge EG2 arranged in a direction perpendicular to the first edge EG1, and the third edge EG3 arranged in the direction crossing the directions in which the first edge EG1 and the second edge EG2 are arranged are arranged in directions different from the scan direction Sd. As a result, all of the first edge EG1, the second edge EG2, and the third edge EG3 have line edge roughnesses.

It is assumed that a direction similar to the scan direction Sd, of the direction in which the first edge EG1 is arranged and the direction in which the second edge EG2 is arranged is the eighth direction DR8 in which the second edge EG2 is arranged. In this case, the line edge roughness of the second edge EG2 arranged in a direction having a small difference from the scan direction Sd may have a value smaller than the line edge roughness of the first edge EG1 arranged in a direction having a large difference from the scan direction Sd. In addition, the line edge roughness of the third edge EG3 arranged in the direction crossing the direction in which the first edge EG1 is arranged and the direction in which the second edge EG2 is arranged may have a value between the line edge roughness of the first edge EG1 and the line edge roughness of the second edge EG2.

The semiconductor layer SEM has been mainly described hereinabove, but the present disclosure is not limited thereto. For example, the gate electrode disposed to overlap the semiconductor layer SEM may also have three edges arranged in different directions based on the same logic, and all of the respective edges may have line edge roughnesses.

As used in connection with various embodiments of the disclosure, each of the position determining unit 2000, and the control unit 3000 may be implemented in hardware, software, or firmware, for example, implemented in a form of an application-specific integrated circuit (ASIC) or a microprocessor.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A maskless exposure device comprising:
a light source, which emits an exposure beam;
a light modulator, which modulates the exposure beam according to an exposure pattern;
an optical system, which transfers the modulated exposure beam onto a substrate in the form of a beam spot array;
a position determining unit, which generates relative position data between the beam spot array and the substrate; and
a control unit, which controls the light modulator based on the position data received from the position determining unit,
wherein the beam spot array includes alignment areas and out-of-alignment areas which are alternately disposed, on/off-spots which overlap the alignment areas, and neutral spots which overlap the out-of-alignment areas and at which the substrate is not irradiated with the modulated exposure beam, and
a distance between on/off-spots adjacent to each other among the on/off-spots at a first point in time is different from a distance between on/off-spots adjacent to each other among the on/off-spots at a second point in time.

2. The maskless exposure device of claim 1, wherein the control unit transfers the exposure pattern in which an arrangement and on-states or off-states of the on/off-spots are adjusted according to an accumulated light amount, to the light modulator.

3. The maskless exposure device of claim 2, wherein the modulated exposure beam and the accumulated light amount are provided in plurality, respectively,
wherein the exposure pattern decreases a deviation between the accumulated light amounts of the modulated exposure beams irradiated to a plurality of patterns disposed on the substrate.

4. The maskless exposure device of claim 1, wherein a width of each of the alignment areas and a width of each of the out-of-alignment areas in a cross-sectional view are the same as each other.

5. The maskless exposure device of claim 1, wherein a distance between the on/off-spots adjacent to each other is about 0.01 micrometers (μm) to about 1.0 μm.

6. The maskless exposure device of claim 1, wherein the modulated exposure beam is provided in plurality,
wherein the control unit
receives the position data from the position determining unit and confirms information of patterns disposed on the substrate, and
determines accumulated light amounts of the modulated exposure beams irradiated to the patterns disposed on the substrate in a scan process in which the substrate moves in a scan direction.

7. The maskless exposure device of claim 6, wherein the control unit generates the exposure pattern changing on-states or off-states of the on/off-spots so that a deviation between the accumulated light amounts is decreased.

8. The maskless exposure device of claim 7, wherein the light modulator modulates the exposure beam according to the exposure pattern.

9. The maskless exposure device of claim 1, wherein each of the alignment areas includes a first alignment area and a second alignment area disposed adjacent to each other with one out-of-alignment area of the out-of-alignment areas therebetween, and
a distance between a center point of the first alignment area and a center point of the second alignment area is twice a shortest distance between the first alignment area and the second alignment area.

10. The maskless exposure device of claim 9, wherein a width of the first alignment area is the same as the shortest distance between the first alignment area and the second alignment area.

11. The maskless exposure device of claim 9, wherein an arrangement of the on/off-spots in the first alignment area is different from an arrangement of the on/off-spots in the second alignment area.

12. The maskless exposure device of claim 1, wherein each of the on/off-spots is in an on-state when the on/off-spot overlaps a pattern disposed on the substrate in an exposure process, and is in an off-state when the on/off-spot does not overlap the pattern in the exposure process.

13. A maskless exposure device comprising:
a light source, which emits an exposure beam;
a light modulator, which modulates the exposure beam according to an exposure pattern;
an optical system, which transfers the modulated exposure beam onto a substrate in the form of a beam spot array;
a position determining unit, which generates relative position data between the beam spot array and the substrate; and
a control unit, which controls the light modulator based on the position data received from the position determining unit,
wherein the beam spot array includes a first spot, a second spot, and a third spot of which on/off are controlled by the light modulator,
at a first point in time, the first spot and the second spot are disposed adjacent to each other, and
at a second point in time, the third spot is disposed between the first spot and the second spot.

14. The maskless exposure device of claim 13, wherein a distance between the first spot and the second spot is about 0.01 μm to about 1.0 μm.

15. The maskless exposure device of claim 13, wherein the modulated exposure beam is provided in plurality,
wherein the control unit
receives the position data from the position determining unit and confirms information of patterns disposed on the substrate, and
determines accumulated light amounts of the modulated exposure beams irradiated to the patterns disposed on the substrate in a scan process in which the substrate moves in a scan direction.

16. The maskless exposure device of claim 15, wherein the control unit generates the exposure pattern changing an on-state or an off-state of the first spot so that a deviation between the accumulated light amounts is decreased.

17. The maskless exposure device of claim 16, wherein the light modulator modulates the exposure beam according to the exposure pattern.

* * * * *